United States Patent [19]

Dohmstreich et al.

[11] Patent Number: 5,644,222
[45] Date of Patent: Jul. 1, 1997

[54] PROCESS FOR TESTING AN ELECTRONIC ELECTRICITY METER

[75] Inventors: Wolfgang Dohmstreich, Lauf; Klaus Windsheimer, Scheinfeld, both of Germany

[73] Assignee: Siemens Aktiengesellschaft, Germany

[21] Appl. No.: 403,871

[22] PCT Filed: Sep. 10, 1993

[86] PCT No.: PCT/EP93/02453

§ 371 Date: Mar. 24, 1995

§ 102(e) Date: Mar. 24, 1995

[87] PCT Pub. No.: WO94/07135

PCT Pub. Date: Mar. 31, 1994

[30] Foreign Application Priority Data

Sep. 24, 1992 [EP] European Pat. Off. ............. 92116359

[51] Int. Cl.$^6$ .................... G07F 17/24; H04Q 9/00
[52] U.S. Cl. .................. 324/74; 340/539; 364/483
[58] Field of Search ........................ 324/74, 140, 141, 324/142, 120, 121, 126, 127; 340/539, 870.02; 364/480–483

[56] References Cited

U.S. PATENT DOCUMENTS

| | | | |
|---|---|---|---|
| 4,213,119 | 7/1980 | Ward et al. | 340/151 |
| 4,454,461 | 6/1984 | Jacobs | 194/200 |
| 5,014,213 | 5/1991 | Edwards et al. | 364/483 |

FOREIGN PATENT DOCUMENTS

| | | |
|---|---|---|
| 0 092 303 | 10/1983 | European Pat. Off. . |
| 0 420 548 | 4/1991 | European Pat. Off. . |
| 2 177 805 | 1/1987 | United Kingdom . |

OTHER PUBLICATIONS etz., vol. 112 (1991), No. 6–7, pp. 320–323; Manfred Schwendtner et al.: *Elektronischer Haus-haltszähler*.

*Primary Examiner*—Kenneth A. Wieder
*Assistant Examiner*—Barry Bowser
*Attorney, Agent, or Firm*—Kenyon & Kenyon

[57] ABSTRACT

The invention relates to an electronic electricity meter (1) having an optical interface (5, 6), which is used to test the load curve of the meter. To this end, after a test message is received from a testing unit (7, 8, 9), the microcomputer (2) of the meter (1) applies load meter pulses to the optical interface (5, 6).

10 Claims, 2 Drawing Sheets

PROCESS FOR TESTING AN ELECTRONIC ELECTRICITY METER

The invention relates to a process for testing an electronic meter having an optical interface.

Figure 3:
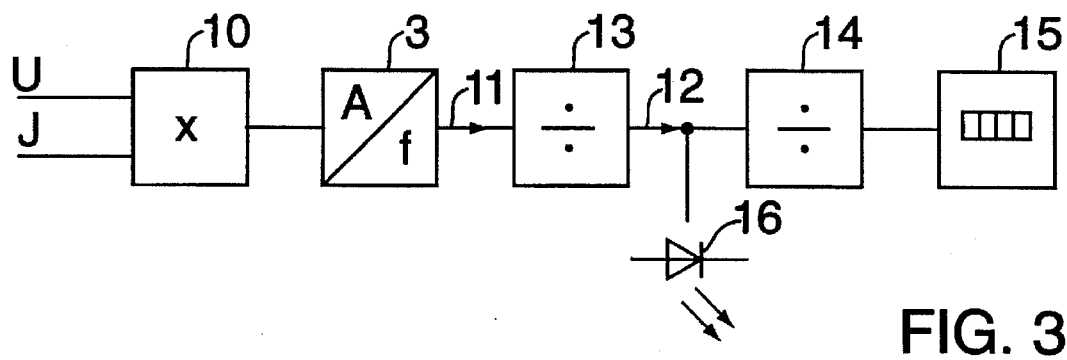

Before being put into use, electricity meters undergo a functional test. This includes, inter alia, testing the load curve of the electricity meter, which is done by measuring precisely defined test loads. The measured value is output at the electricity counter by a flashing light-emitting diode and picked up by a testing unit via a scanning head. FIG. 3 depicts the fundamental block diagram of an electricity meter of this type, with the power being indicated by a flashing diode. The quantities current I and voltage U measured in the load circuit are first multiplied in a multiplier element 10, and the resultant power is relayed to a power-frequency converter 3, at whose output pulses 11 having a specific pulse significance are emitted. A quite specific amount of energy that is always the same corresponds in this case to one pulse. To make these pulses visible and distinguishable to the human eye by means of a light emitting diode 16 even in the case of a heavy load, the flashing frequency should amount to a maximum of 10 Hz in this case. Accordingly, it is necessary to divide the pulses 11 by a divider 13 to make available pulses 12 with a pulse significance which will maintain a flashing frequency that is still perceptible to the human eye. The pulses 12 are supplied to another divider 14, which triggers a subsequent register (counting mechanism) 15. To pick up the measurable value, as mentioned, the flashing diode 16 is scanned by a scanning head of the testing unit. When small loads are measured, a correspondingly low flashing frequency results, so that the measuring duration is relatively long. In terms of technical implementation, very little expenditure is required to use a red light emitting diode as a flashing diode, since small transmitting capacities suffice for this and, on the other hand, a simple scanning head is all that is needed. Because the red light emitting diode can be easily mixed up with a warning signal for fault or spurious conditions and error situations, there is, however, a customer demand for green or orange-colored light emitting diodes. However, this entails problems for the scanning operation, as special and more costly scanning heads are needed.

The problem delineated here is encountered both in the case of Ferraris meters, as well as in the case of electronic electricity meters of a known type of construction. The latter usually have a bidirectional infrared interface, via which data can be retrieved from the electricity meter or input into this meter. A request message is sent via this interface to the meter, which responds to the message by sending out e.g. the register counts, or by depressing a push-button control, all data. A scanning head that differs from the one mentioned above is needed for this function.

The object of the invention is to conceive of a process for testing an electronic electricity meter of the above-mentioned type, which will make it possible to shorten the testing duration and reduce the expenditure required for the testing unit. This is achieved by a process having the features according to claim 1. Moreover, it will make it possible to dispense with the scanning head used to scan the flashing diode, i.e., to test the meter, it will suffice to use the scanning head that is already required anyway for the optical interface.

When medium and heavy loads are measured, it can be that the flashing frequency of the light emitting diode is still high enough to indicate the power, so that it is regarded as sufficient to inject the meter pulses at the light emitting diode into the infrared interface in accordance with claim 2.

One especially advantageous specific embodiment consists in feeding the meter pulses with the first request message to the infrared transmitting diode for a predetermined time period and, after expiration of this time period, inputting a second request message into the meter via its optical interface, the result being that this second request message causes status data pertaining to the meter to be output as a coded status word via the same optical interface. The status data are expediently stored in a status register.

The test duration for measuring the load curve and the subsequent status interrogation are shortened when the status interrogation immediately follows the meter measurement, when this is completed before expiration of the predetermined time period, and when, to this end, the meter measurement is complete, the test load is switched off, which causes the flashing of the light emitting diode to be interrupted, and when during this interruption, the second request message is input for purposes of status interrogation via the optical interface into the meter.

When small loads are measured, a corresponding low flashing frequency of the flashing diode results, which leads to long test times. To avoid this, it is advantageous when the meter pulses, which have a higher pulse significance than the meter pulses effecting the flashing of the light-emitting diode, are fed to the infrared transmitting diode of the optical interface.

One obtains comprehensive information about the status of the meter when the status word includes the status of the control lines of a microcomputer in the meter, as well.

The invention will be elucidated in the following on the basis of an exemplary embodiment.

Figure 1:
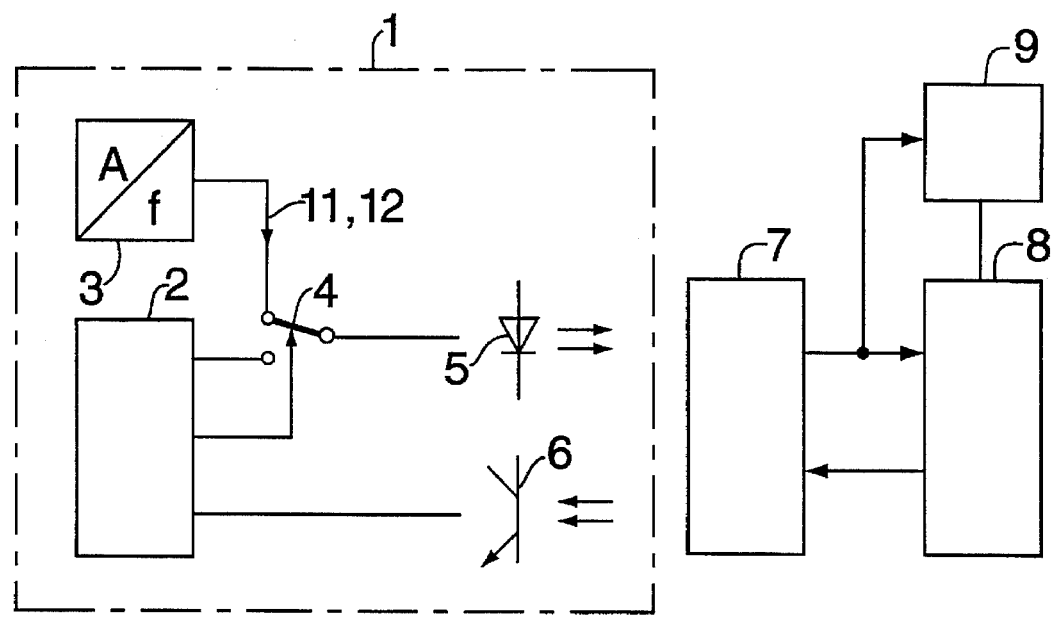
Figure 2:
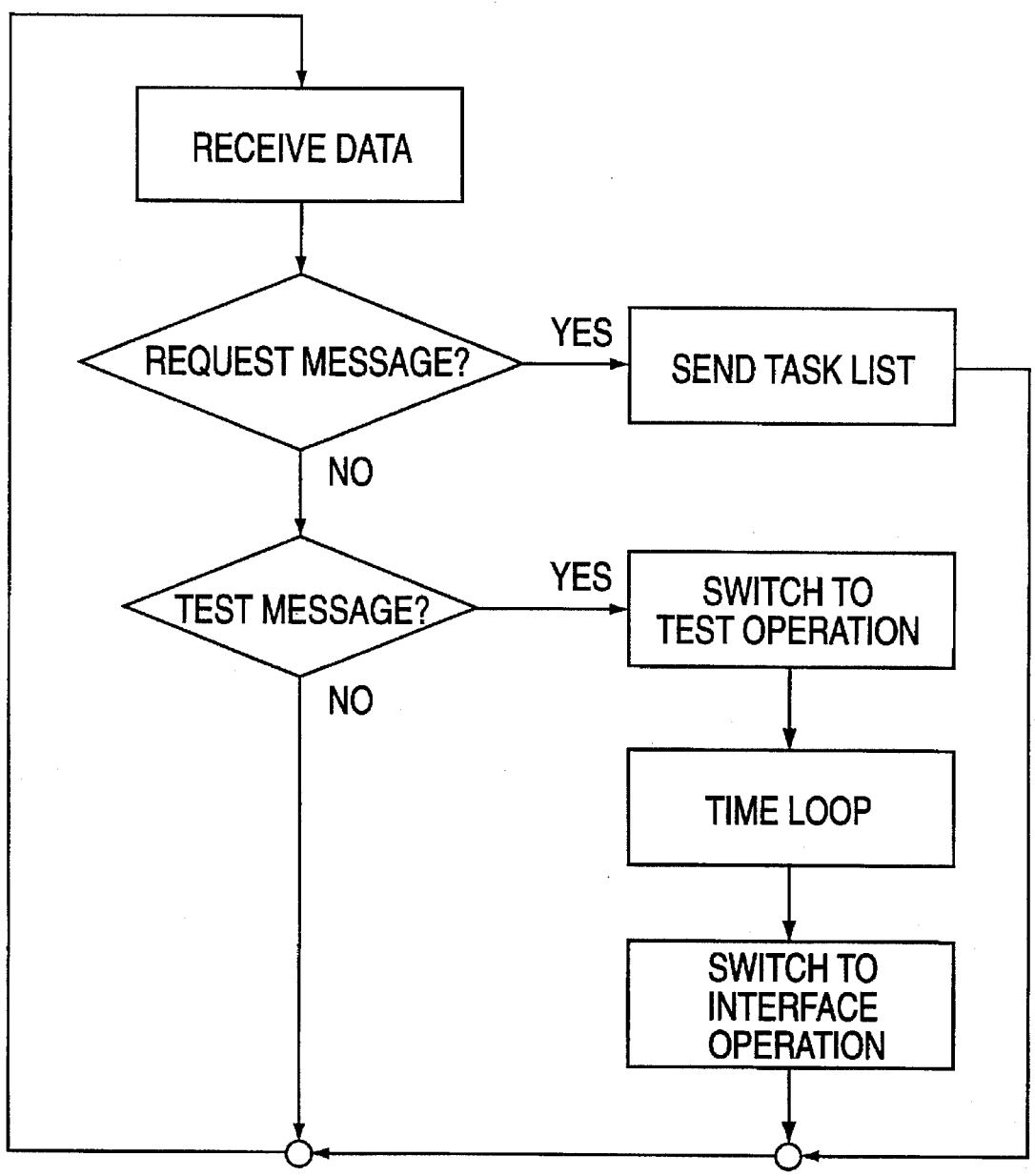

The Figures show:

FIG. 1 a basic diagrammatic representation of an electronic meter according to the invention having an optical interface;

FIG. 2 a flow chart of the above-mentioned process;

FIG. 3 a block diagram of an electricity meter according to the known type of construction.

FIG. 1 depicts an electricity meter 1 having an optical interface (IR interface), which comprises an infrared transmitting diode 5 and an infrared receiver 6. A microcomputer 2 and a power-frequency converter 3, as is also shown in FIG. 1, for example, belong to the electricity meter 1. Opposite the optical interface 5, 6 is a testing unit comprising an opto-head (also known as an optical head) 7, which communicates with a computer testing station 8 and an error-computing device 9. In this case, the opto-head 7 represents the transmitting and receiving device of the entire testing unit.

The meter measurement via the optical interface 5, 6 is carried out in accordance with the following process, whose functional sequence is reproduced in a simplified form in FIG. 2. Accordingly, the microcomputer 2 of the meter 1 receives data via the optical interface 5, 6. A request message and a test message are provided as data in the present flow chart. When the request message is received, the microcomputer 2 sends an electricity accounting list with its register contents, such as the register reading via the infrared transmitting diode 5. This function is already known in the case of electricity meters having a modern type of construction. The test message that is newly added in accordance with the invention, described above as the first request message, causes the microcomputer 2 to switch for a predetermined period of time to the test operation, in which the pulses 11 or 12 (see FIG. 1) are routed via a switch 4 to the infrared transmitting diode 5. The opto-head 7 detects these pulses and routes them to the error-computing device 9. After a time loop has elapsed, or when the testing unit sends a discontinuation message, the shift to normal interface operation is made again, i.e., the switch 4 is returned to its initial position.

As mentioned, meter pulses 11, 12 having a variable pulse significance can be injected. To shorten the test duration when measuring small loads, it is especially advantageous to inject the more significant meter pulses 11 for the measurement in place of the less significant meter pulses at the light emitting diode 16 in accordance with FIG. 3. It can be specified by way of the infrared interface which meter pulses of a certain significance are supposed to be output. This adaptability is absolutely necessary to be able to undertake, if desired, an adjustment to the processing speed of the testing unit.

The above described process makes it possible to automatically read out the register data via the infrared interface. The electricity meter can also be parameterized via the same interface.

Besides testing the load curve of the meter, it is also of interest to check other states of the meter, such as the status of its ripple-control receiver. This ripple-control receiver can assume three states, which are indicated by a light-emitting diode to the meter reader. Instead, it is also possible, however, for the status of the ripple-control receiver to be routed with one status word via the infrared interface 5, 6 to the testing unit. The status word can, of course, include still further status information. For example, it can include the interrogation whether the load state is above or below the start-up threshold, as well as the interrogation concerning the scale, i.e. the present setting to high or low scale. It is also possible to check the microcomputer 2 and its control inputs via this infrared interface 5, 6. To this end, the control inputs are activated as electrical signals are applied, and the reaction to the input signals is checked.

To introduce the status interrogation check, a further, second test message, which is not mentioned in the flow chart and is described above as a second request message, is to be provided. In this mode, the switch 4 has the same position as in the case of the outputting of the electricity accounting list in interface operation.

Special precautions have to be taken when the status interrogation is supposed to directly follow termination of the meter measurement, i.e., before the time loop elapses. In this case, the outputting of meter pulses via the light emitting diode 16 (FIG. 1) has to be stopped or suppressed to prevent a disruptive injection of these optical signals in the infrared receiver 6, which is designed, e.g., as a receiving phototransistor. A test message input at the JR interface for introducing the status interrogation would no longer be readable because of such an injection. Therefore, the meter pulse duration must be limited to a certain time period, after the expiration of which, data, i.e., messages can be received from the meter 1. Another possibility is to reduce the power, as far as the testing unit is concerned, to entirely do away with the meter pulses entirely or to allow them to run only very slowly.

A fully automatic test of the meter can be performed in accordance with the described process. With the help of a first message request, the meter pulses are fed to the infrared interface 5, 6. Another request message can be used to interrogate the status of the electricity meter.

We claim:

1. A method for testing an electricity meter including a light emitting diode and an optical interface having an infrared transmitting diode, said method comprising the steps of:

applying a test load having a predetermined energy level to the electricity meter;

generating a first plurality of meter pulses having a frequency corresponding to the predetermined energy level;

dividing the first plurality of meter pulses to form a second plurality of meter pulses;

feeding the second plurality of meter pulses to the light emitting diode;

causing the light emitting diode to generate a visible display representing the predetermined energy level of the test load; and transmitting a first request message to the optical interface to initiate an injection of at least one of the first and second plurality of meter pulses to the infrared transmitting diode.

2. The method of claim 1, wherein the plurality of meter pulses fed to the light emitting diode have a maximum operating flashing frequency of 15 Hz.

3. The method of claim 1, wherein said second plurality of meter pulses is injected into the infrared transmitting diode for a predetermined time period, after which a status inquiry is initiated by transmitting a second external request message to the optical interface, said status inquiry comprising outputting status data through the optical interface.

4. The method of claim 2, wherein the electricity meter maintains said status data in a status register.

5. The method of claim 2, wherein said status inquiry immediately follows said meter measurement, said method further comprising the steps of:

switching off the test load if said meter measurement terminates prior to expiration of the predetermined time period for feeding said second plurality of meter pulses to said light emitting diode; and transmitting said second request message to the optical interface while the test load is switched off.

6. The method of claim 1, wherein said first plurality of meter pulses has a higher frequency than said second plurality of meter pulses.

7. The method of claim 2, wherein said status data comprises information about one or more control lines for a microcomputer included in the electricity meter.

8. An electricity meter comprising:

a microcomputer;

an optical interface coupled to said microcomputer and including an infrared transmitting diode;

a power/frequency converter coupled to said microcomputer;

a divider coupled to the power/frequency converter;

a light emitting diode coupled to the divider; and a means for applying a test load having a predetermined energy level to said power/frequency converter, wherein after a test load has been applied to the electricity meter, said power/frequency converter converts the test load to a first plurality of meter pulses having a frequency corresponding to the predetermined energy level, and feeds said plurality of meter pulses to said divider, said divider divides said first plurality of meter pulses to form a second plurality of meter pulses which are fed to said emitting diode, wherein a receipt by said optical interface of an external request for a meter measurement causes switching means to switch one of the first and second plurality of pulses to said infrared transmitting diode, and wherein the light emitting diode provides a visual indication of the predetermined energy level.

9. The electricity meter of claim 8, further comprising a memory for maintaining information pertaining to a status of the electricity meter, wherein said status information is communicated by outputting a status word through said optical interface.

10. The electricity meter of claim 8, wherein said microcomputer outputs status data through said optical interface in response to an external request for a status inquiry.

* * * * *